United States Patent [19]
Bayraktaroglu

[11] Patent Number: 5,496,755
[45] Date of Patent: Mar. 5, 1996

[54] INTEGRATED CIRCUIT AND METHOD

[75] Inventor: Burhan Bayraktaroglu, Plano, Tex.

[73] Assignee: Texas Instruments Incorporated, Dallas, Tex.

[21] Appl. No.: 287,378

[22] Filed: Aug. 8, 1994

Related U.S. Application Data

[62] Division of Ser. No. 443,538, Nov. 29, 1989, Pat. No. 5,347,149.

[51] Int. Cl.$^6$ ................................................. H01L 21/70
[52] U.S. Cl. .................. 437/51; 437/52; 437/59; 437/60; 437/61
[58] Field of Search ................................. 437/51, 52, 59, 437/60, 61

[56] References Cited

U.S. PATENT DOCUMENTS

| 4,745,445 | 5/1988 | Mun et al. . | |
| 4,789,645 | 12/1988 | Calviello et al. | 437/51 |
| 4,959,705 | 9/1990 | Lemnios et al. | 437/51 |

Primary Examiner—Brian E. Hearn
Assistant Examiner—Kevin M. Pilarpas
Attorney, Agent, or Firm—Michael K. Skrehot; James C. Kesterson; Richard L. Donaldson

[57] ABSTRACT

Integrated circuits and fabrication methods incorporating both two-terminal devices such as IMPATT diodes (446) and Schottky diodes (454) and three-terminal devices such as n-channel MESFETs (480) in a monolithic integrated circuit.

4 Claims, 9 Drawing Sheets

INTEGRATED CIRCUIT AND METHOD

CROSS-REFERENCE TO RELATED APPLICATIONS

This is a divisional of application Ser. No. 07/443,538, filed Nov. 29, 1989, now U.S. Pat. No. 5,347,149. U.S. patent application Ser. Nos. 063,554, filed Jun. 18, 1987 (Tran); 067,527, filed Jun. 26, 1987 (Bayraktaroglu); 107,234, filed Oct. 9, 1987 (Plumton et al); 312,100, filed Feb. 16, 1989 (Bayraktaroglu); and 312,101, filed Feb. 16, 1989 (Morris et al) disclose related subject matter. All of these cross-referenced items are assigned to the assignee of this application.

BACKGROUND OF THE INVENTION

1. Field of the Invention

The present invention relates to semiconductor electronic integrated circuits, and, more particularly, to integrated circuits made of III–V compound semiconductors including both two-terminal and three-terminal devices.

2. Description of the Related Art

Communications, missile guidance, radar, and various other applications of microwave technology all would benefit from the lower cost of monolithic integration of components and subsystems. However, hybrid technology permits combinations of varying device types, circuits on varying substrate types, and passive components that are not entirely compatible with monolithic microwave integrated circuits (MMIC) technology. The best use of hybrid technology arises when high performance is required from a given circuit. In this case discrete devices (of possibly various types) are chosen and screened to insure maximum performance, passive circuits are produced on low loss substrates, and after devices are connected to the circuits some tuning is applied to obtain the maximum performance for the resulting hybrid arrangement.

Conversely, MMIC technology is currently based on the use of only one type of three-terminal device performing all of the circuits functions. The commonly used device type is the Schottky barrier gate GaAs field effect transistor (MESFET). The MESFET is flexible enough to be used in low noise amplifier, power amplifier, switch, mixer, doubler, and many other circuits. It performs most of these functions satisfactorily but none of them optimally. Further, a higher frequencies some of the system functions cannot be performed by three-terminal devices due to their inferior frequency response characteristics, and two-terminal devices must be employed.

The design and fabrication techniques for three-terminal and two-terminal types of devices are often different enough that the fabrication of circuits containing both types are only accomplished with multiple chips. Two-terminal devices such as mixers, IMPATT diodes, and Gunn diodes are normally produced in a way that the substrate becomes one of the terminals. A three-terminal device, such as a MESFET, is fabricated with all of its terminals on the top surface of a semi-insulating substrate. Furthermore, the epitaxial layer types and thicknesses for each type of device are sufficiently different from each other to preclude the growth of all layers in a single deposition run.

Chu et al, 28 IEEE Tr.Elec.Dev. 149 (1981) describe a 31 GHz receiver circuit where a regrowth technique was employed to deposit epitaxial layers suitable for mixers selectively on the surface; the remainder of the substrate was covered with MESFET material. This technique was later applied to the fabrication of a 35 GHz down converter: Chu et al, 1987 IEEE Microwave and Millimeter-Wave Monolithic Circuits Symposium, pp. 63–67. In addition to the mixers and MESFETs, this circuit contained a Gunn diode serving as a local oscillator. Although operation of all components was demonstrated in separate chips, monolithic integration was not shown, and the proposed integration technique was again limited to the selective regrowth previously described. Regrowth is a difficult technique and it is a problem of the known monolithic integration methods to provide simple and reliable processing.

SUMMARY OF THE INVENTION

The present invention provides monolithic integration of high frequency two-terminal and three-terminal devices by a single doped-layers overgrowth on a semi-insulating substrate; a common doped layer provides MESFET channels, Schottky diodes, and IMPATT drift regions.

This avoids the use of etchback and regrowth techniques and solves the problems of the known methods.

BRIEF DESCRIPTION OF THE DRAWINGS

The drawings are schematic for clarity.

FIGS. 3a–l show in cross sectional elevation views steps in a first preferred embodiment method of fabrication.

DESCRIPTION OF THE PREFERRED EMBODIMENTS

Figure 1:
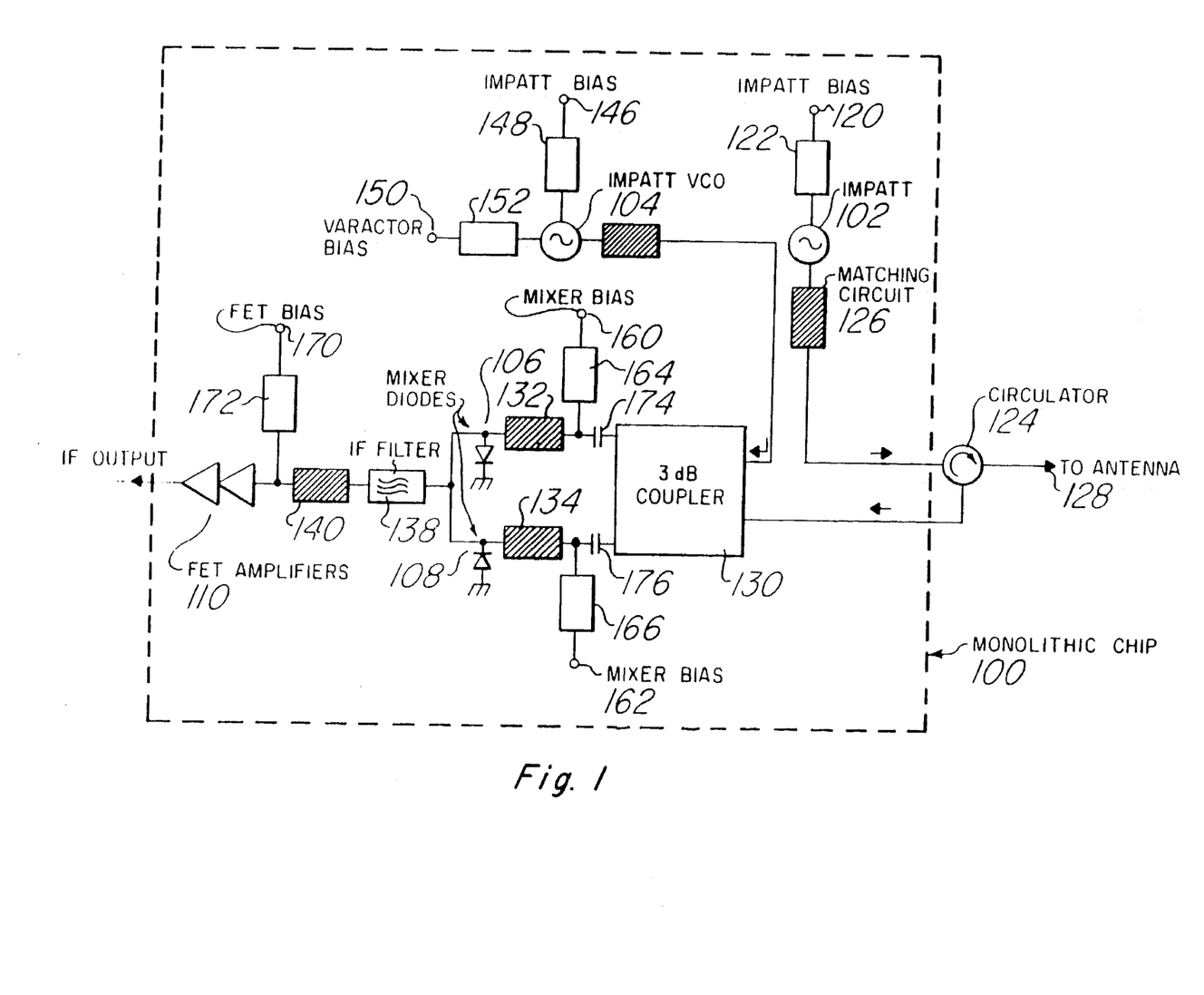
FIG. 1 is a schematic diagram of a first preferred embodiment integrated circuit.

FIG. 1 is a schematic diagram of first preferred embodiment integrated circuit, generally denoted by reference numeral 100, which can operate as a complete transmit/receive circuit of a typical radar. Circuit 100 includes three types of devices: IMPATT diodes in oscillators 102 and 104, Schottky barrier diodes in mixers 106 and 108, and MESFETs in amplifiers 110. The operation of embodiment 100 is as follows: transmitter power is generated by high-power IMPATT oscillator 102 which includes a resonator plus an IMPATT diode biased into negative resistance breakdown by an external dc power supply through contact pad 120 and rf isolation 122: the output of oscillator 102 is fed to off-chip circulator 124 through impedance matching circuit 126 and on to antenna 128. Incoming signals are received by antenna 128 and pass through circulator 124 to coupler 130 which adds the output of local oscillator 104 to the signals and then feeds them through impedance matching circuits 132 and 134 to mixer diodes 106 and 108 which form a balanced mixer. The output of the mixer passes through IF filter 138 and impedance matching circuit 140 to amplifiers 110 and then off chip. Local oscillator 104 includes a resonator plus an IMPATT diode biased into negative resistance breakdown by an exteral dc power supply through contact pad 146 and rf isolation 148 for power generation and an IMPATT diode reversed biased (but not into breakdown) by an external dc voltage control through contact pad 150 and rf isolation 152 for varaiable capacitor (varactor) control of the oscillation frequency. Similarly, external dc bias is supplied through contact pads 160 and 162 and rf isolation 164 and 166 to mixer diodes 106 and 108, and through contact pad 170 and rf isolation 172 to MESFETs in amplifier 110. Capacitors 174 and 176 dc isolate coupler 130 from the mixer.

Figure 2A:
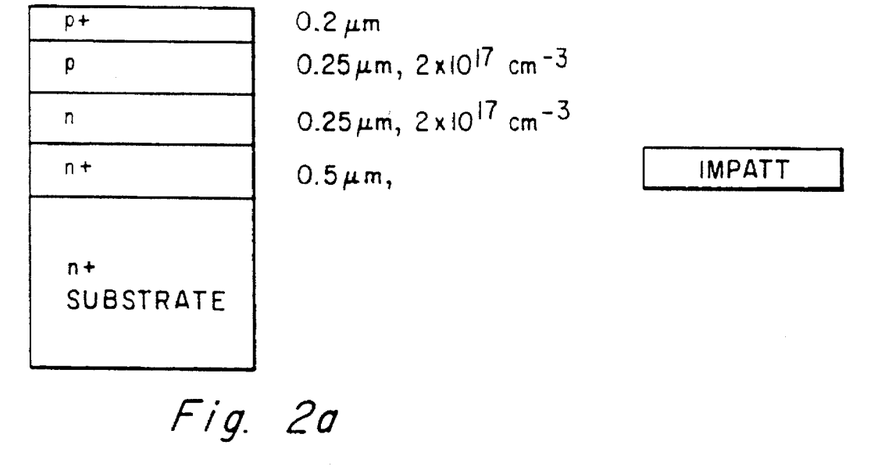
FIGS. 2a–c illustrate in cross sectional elevation view the typical material requirements for the devices of the first preferred embodiment.
Figure 2B:
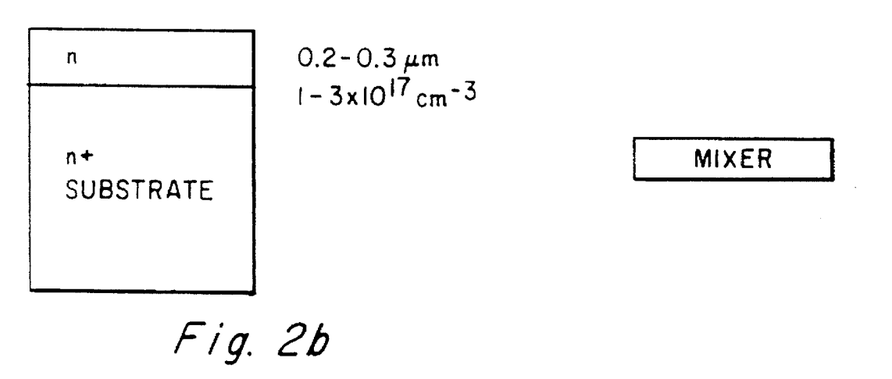
Figure 2C:
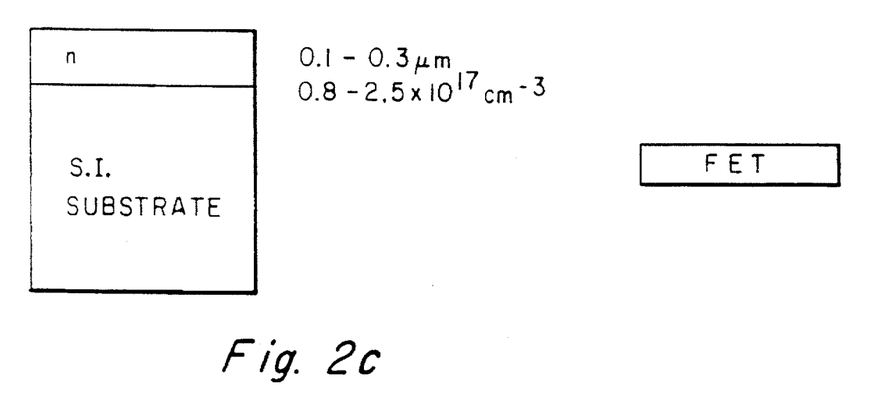

FIG. 2 illustrates the typical starting materials for three types of devices in the first preferred embodiment: IMPATT diode, Schottky diode (mixer diode), and MESFET. As illustrated, IMPATT diodes have thin, lightly doped p and n avalanche drift regions which are contacted by heavily doped regions: for operation about 60 GHz the drift regions are each about 0.25 µm thick with doping levels of about $2\times10^{17}$ dopants per $cm^3$, and either the $p^+$ or $n^+$ contact region may be the substrate. In contrast, the Schottky diode requires a heavily doped substrate under a lightly doped (1 to $3\times10^{17}$ dopants per $cm^3$) region of thickness in the range of 0.2–0.8 µm depending upon the frequency of operation and power handling capacity requirements. Lastly, a MESFET channel region is lightly doped (0.8 to $2.5\times10^{17}$ dopants per $cm^3$) and of thickness 0.1 to 0.3 µm and located on a semi-insulating substrate.

FIGS. 3a–j illustrate in cross sectional elevation view a first preferred embodiment method of fabrication of integrated circuit 100; for convenience, only single example of each of the three types of devices of integrated circuit 100 will be shown and interconnecting transmission lines, capacitors, and so forth will be omitted.

Figure 3A:
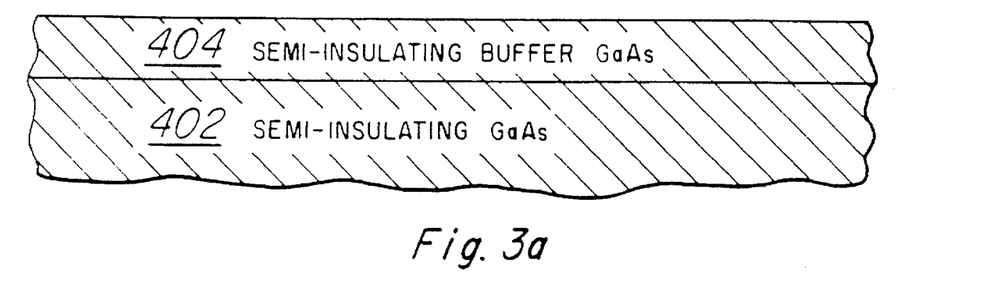
Figure 3B:
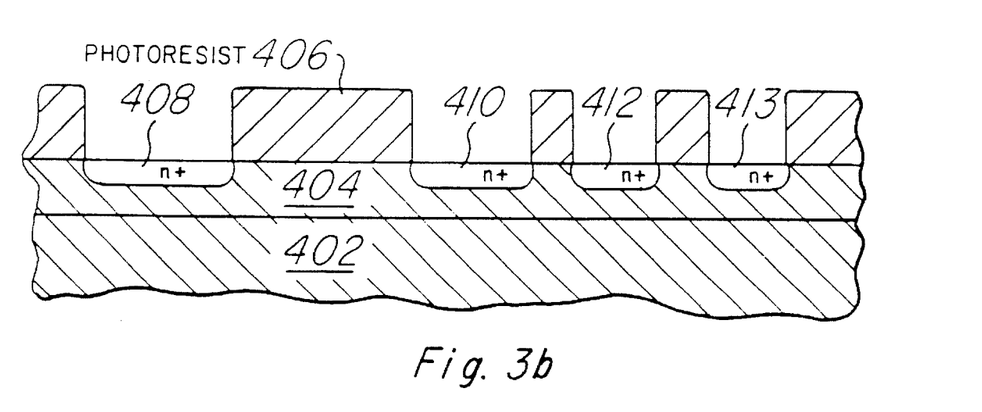
Figure 3C:
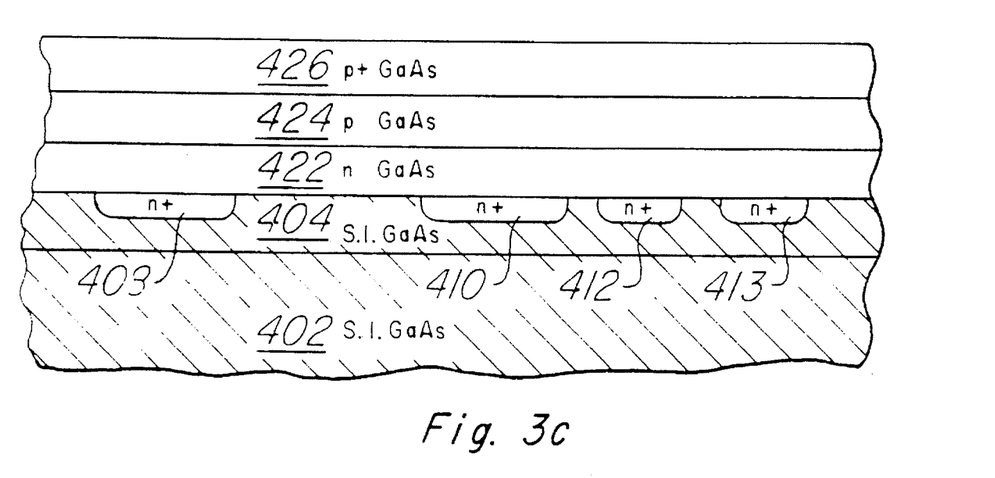
Figure 3D:
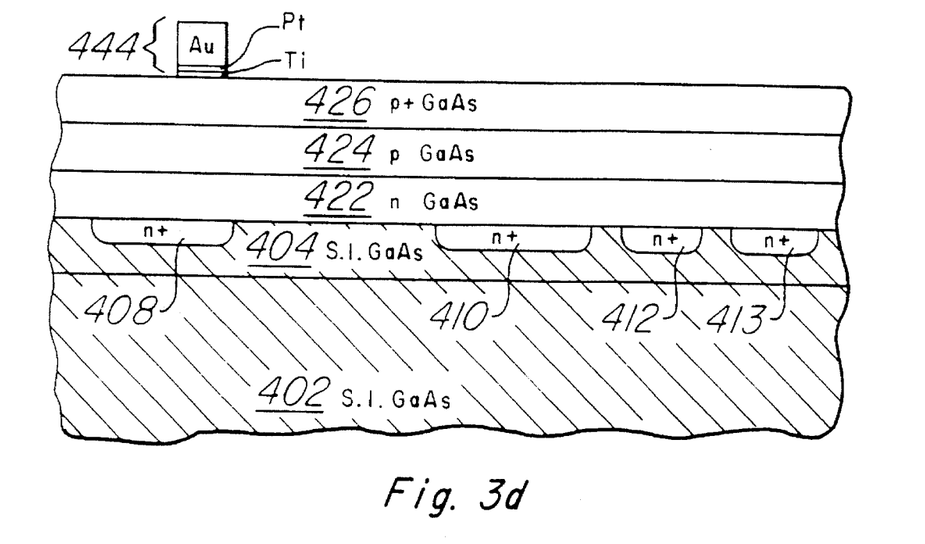

(a) A starting material for the method is shown in FIG. 3a; note that the vertical dimension is greatly exaggerated in the drawings for clarity. The starting material is composed of a semi-insulating GaAs substrate 402 oriented in the (100) direction on which 1 micron thick epitaxial layer 404 of semi-insulating GaAs has been grown. The epitaxial layer 404 is optional and could be omitted. Substrate 402 would typically be a two inch diameter wafer with a thickness of 625 µm. The wafer thickness will be reduced to about 100 µm following the completion of the integrated circuit processing.

(b) Photoresist 406 is spun on the starting material and patterned to define the location of the n-channel MESFET source and drain, the Schottky diode, and the IMPATT diode. Using photoresist 406 as an implant mask, silicon is implanted into epilayer 404 at an energies of 30, 60, and 180 keV and a total dose of $3\times10^{13}/cm^2$ to form $n^+$ buried layers 408, 410, 412, and 413 doped about $2\times10^{18}/cm^3$ and extending from about the surface to to a depth of about 0.6 µm. See FIG. 3b; these implants will be activated during step (c).

(c) Photoresist 406 is stripped and the surface is cleaned. Then an epitaxial metalorganic chemical vapor deposition (MOCVD) is performed at temperatures of about 800° C. in an overpressure of arsenic to grow further layers on layer 404; this anneals the previously described implants of silicon resulting in good electrical activation. As an alternative, the substrate can be annealed in a conventional furnace or rapid thermal annealer prior to the epi growth. The epi growth first forms epilayer 422 of n GaAs of thickness 0.2 µm and in situ doped with silicon to about $2\times10^{17}/cm^3$. Then epilayer 424 of p GaAs of thickness 0.2 µm and in situ doped with zinc to about $2\times10^{17}/cm^3$ and epilayer 426 of $p^+$ GaAs of thickness 0.2 µm and in situ doped with zinc to about $1\times10^{19}/cm^3$ are grown. See FIG. 3c. Alternatively, the growth may be immediately preceded by a 900° C. anneal for fifteen minutes in the MOCVD reactor, or the growth may be by MBE rather than MOCVD.

(d) Form IMPATT diode top contact 444 by spinning on photoresist and patterning an opening to define contact 444 as a circle 5 µm in diameter, evaporating 0.1 µm of titanium, 0.05 µm of platinum, and 0.4 µm of gold, and lifting-off the patterned photoresist so as to leave contact 444. See FIG. 3d. The gold is primarily to prevent oxidization of the titanium, the titanium is chosen for its good adherence to and low metallurgical reaction with GaAs, and the platinum prevents the gold from forming an alloy with the titanium.

Figure 3E:
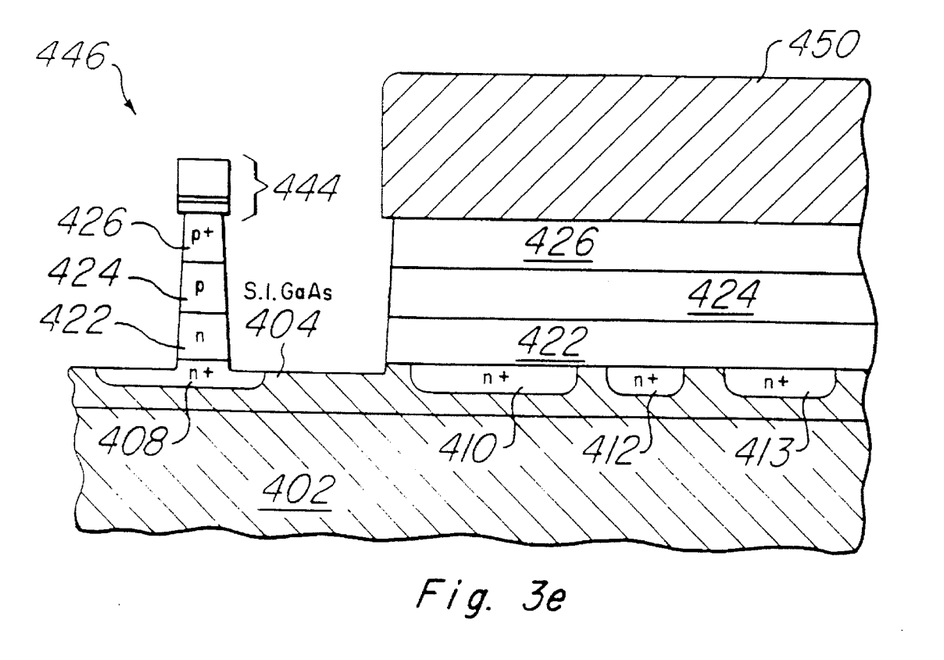
Figure 3F:
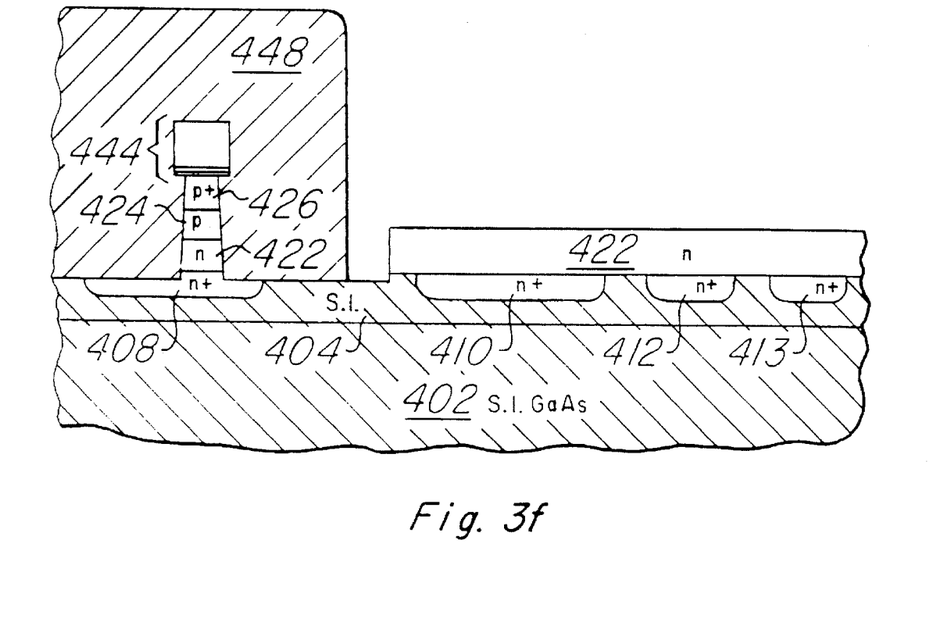
Figure 3G:
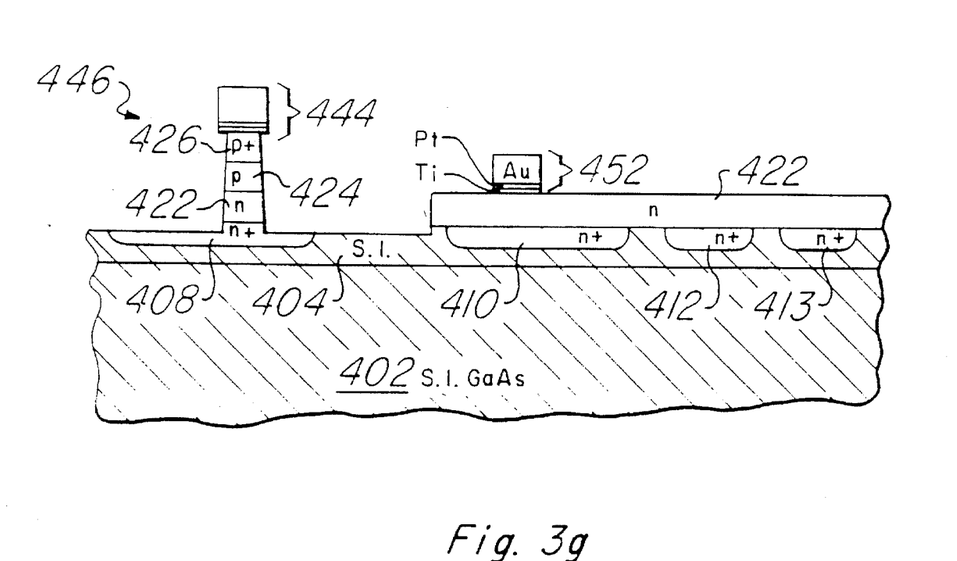
Figure 3H:
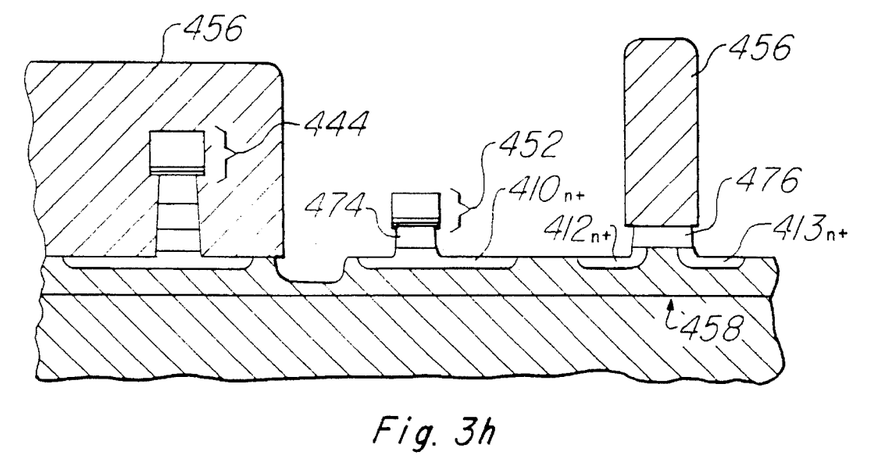
Figure 3I:
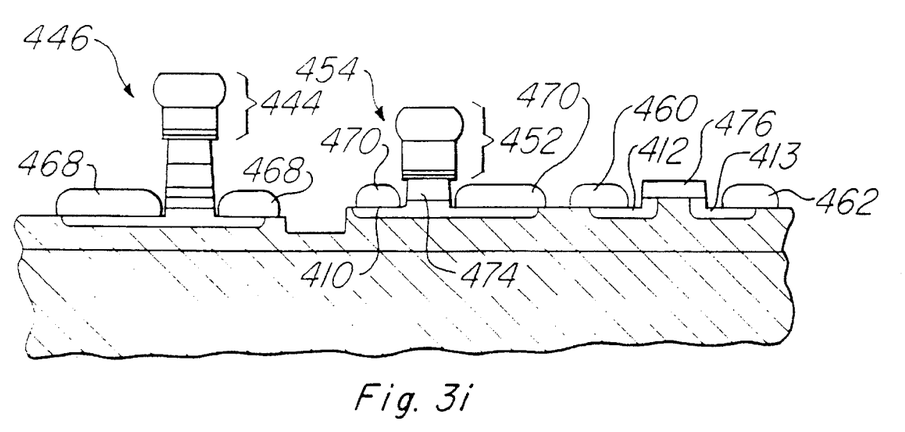
Figure 3J:
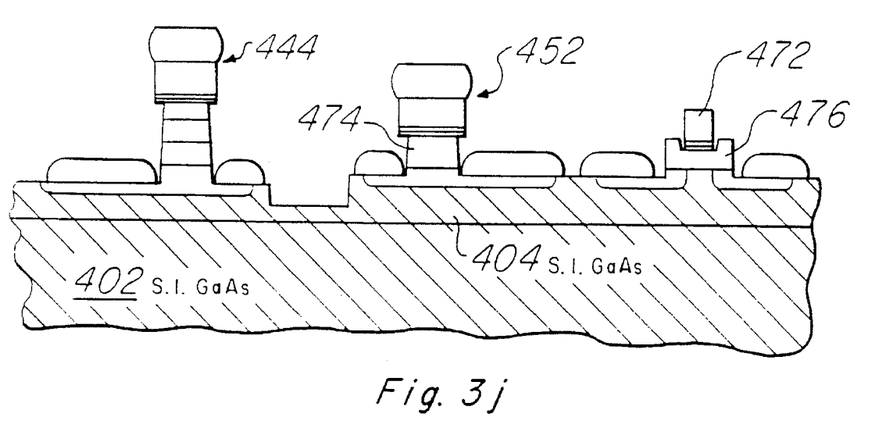

(e) Spin on photoresist 450 and pattern it to protect the areas away from the location of IMPATT diode top contact 444. Etch layers 426, 424, 422, and 404 with contact 444 and patterned photoresist 450 as the etch mask by a timed wet etching to stop in layer 404; this forms IMPATT diode 446 with a base diameter of 5 µm. The etchant may be a solution of hydrogen peroxide, water, and sulfuric acid; and the large thickness of layer 404 allows for ease of stopping the etch in layer 404. The isotropic nature of this etch leads to an overhang by contact 444; see FIG. 4e and recall that the vertical scale is greatly exaggerated for clarity so the characteristic circular isotropically etched surface under the overhang appears pyramidal.

(f) Remove patterned photoresist 450, and spin on photoresist 448 and pattern it to cover IMPATT 446 and adjacent areas. Remove the exposed portions of $p^+$ layer 426 and p layer 424 (that is, all of the layers except the part incorporated into IMPATT 446) by anodic oxidation in the absence of light. Since holes are needed for oxidation, the $p^+$ and p layers are readily anodized. However, when the anodization reaches the n layer 422, a mechanism is needed to generate holes to continue oxidation. In the absence of light, this can only be done by avalanche breakdown of the reversed biased junction formed by n layer 422 and the anodization electrolyte. If the voltage applied across the anodization cell is kept below the level neeeded for this avalanche ionization, then the oxidation process can be stopped at n layer 422. Similarly, the exposed portions of semi-insulating buffer layer 404 does not oxidize with low applied voltage. Anodic oxides are then removed chemically without etching the GaAs further and this yields a precise removal of the $p^+$ and p layers. See FIG. 3f.

(g) Remove photoresist 448 and spin on new photoresist and pattern an opening to define the location of the Schottky mixer diode (about 5 µm in diameter). Evaporate titanium, platinum, and gold as in step (d) and lift-off to form Schottky contact 452 of mixer diode 454; see FIG. 3g.

(h) Spin on photoresist 456 and pattern it to define the location 458 of MESFET 480 plus protect IMPATT 446 areas. Use a wet etch such as hydrogen peroxide plus sulfuric acid in water to etch away layer 422 except the portion protected by Schottky contact 452 (which forms diode region 474) and the patterned photoresist 456 (which fores MESFET channel region 476). The etch is timed and proceeds until about 0.1 µm of layer 404, including doped regions 410, 412, and 413, is removed. See FIG. 3h.

(i) Remove the patterned photoresist 456, and spin on new photoresist layer and pattern openings to define the location of IMPATT diode 446 bottom contact 468 (which surrounds IMPATT diode 446), mixer diode bottom contact 470 (which surrounds mixer diode 454), MESFET source contact 460, MESFET drain contact 462, and interconnection lines (including microstrip transmission line top conductors) which are not shown for clarity. Evaporate 0.05 µm of gold germanium alloy, 140 Å of nickel, and 0.2 µm of gold, and lift-off the patterned photoresist and the metal on it. IMPATT diode top contact 444 and mixer diode top contact 452 act as part of the mask during the evaporation and lead to self-aligned bottom contacts 468 and 470 due to the overhangs; see FIG. 3i. Top contacts 444 and 452 are increased in thickness by the evaporations, and the self-aligned nature of bottom contacts 468 and 470 minimizes parasitic series resistance in both diode types. The wafer is heated to 435° C. for two minutes (or alternatively at 450° C. for twenty seconds in a rapid thermal anneal system) to alloy the gold germanium/nickel with the GaAs to from ohmic contacts.

(j) Photoresist is spun on and an opening patterned to define the location of gate 472 for MESFET 480; for small gate lengths the photoresist may be replaced by a resist such as PMMA (polymethylmethacrylate) and the exposed by an electron beam. If a recessed gate is desired, then a timed isotropic etch of the exposed portion of n channel region 476 by water, hydrogen peroxide, and sulfuric acid ($H_2O:H_2O_2:H_2SO_4$) is used; this etch undercuts the resist and provides a recess slightly larger than the gate. Titanium/platinum/gold is deposited by evaporation to thicknesses of 0.1/0.05/0.4 μm and lifted-off with the photoresist to form gate 472; see FIG. 3*j* which shows that gate 472 is spaced away from the recess edges by the undercut during the etch.

Figure 3K:
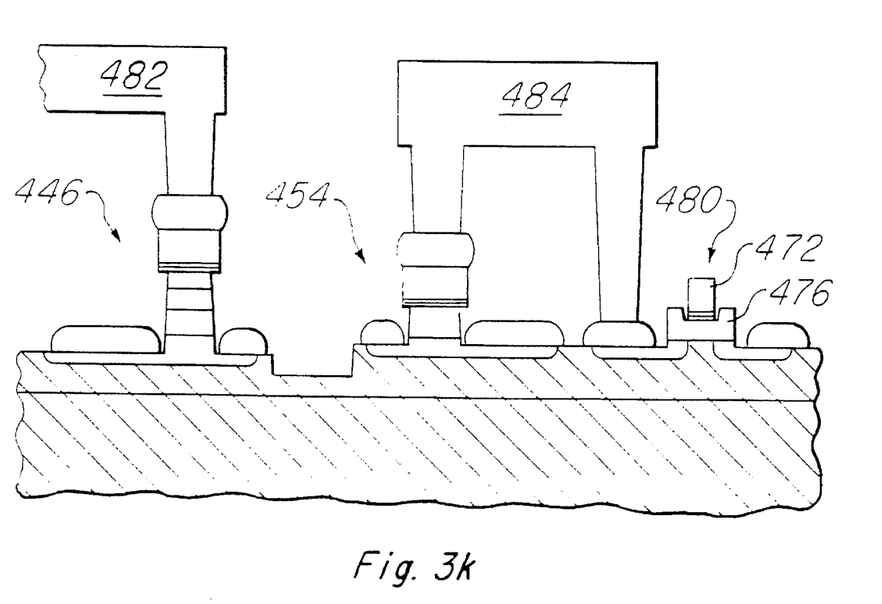

(k) Form air bridges 482 and 484 to connect the diode top contacts 444 and 452 to the other circuitry on the substrate (mixer diode top contact 452 is shown connected to MESFET source contact 460 by air bridge 484) by spinning on a first photoresist layer, patterning openings to IMPATT diode top contact 444, Schottky mixer diode top contact 452 and to connection areas on the substrate, sputtering a thin layer of gold, spinning on a second photoresist layer without removing the patterned first layer, patterning the same openings plus the bridging connections between the openings in the second layer, and plating gold to a thickness of 3.0 μm on the exposed gold. Remove the second photoresist layer by exposing it to ultraviolet light and developing, etch off the thin gold that was between the first and second photoresist layers, and remove the first photoresist layer with hot acetone. See FIG. 3*k*.

(l) Lap substrate 402 down to a thickness of 100 μm. Form vias 492 and 494 in the backside of substrate 402 by photoresist masking and reactive ion etching, the etch stops on bottom contacts 468 and 460. Lastly, gold plate the backside, including vias 492 and 494 to form ground plane 496. See FIG. 3*l*.

Figure 4:
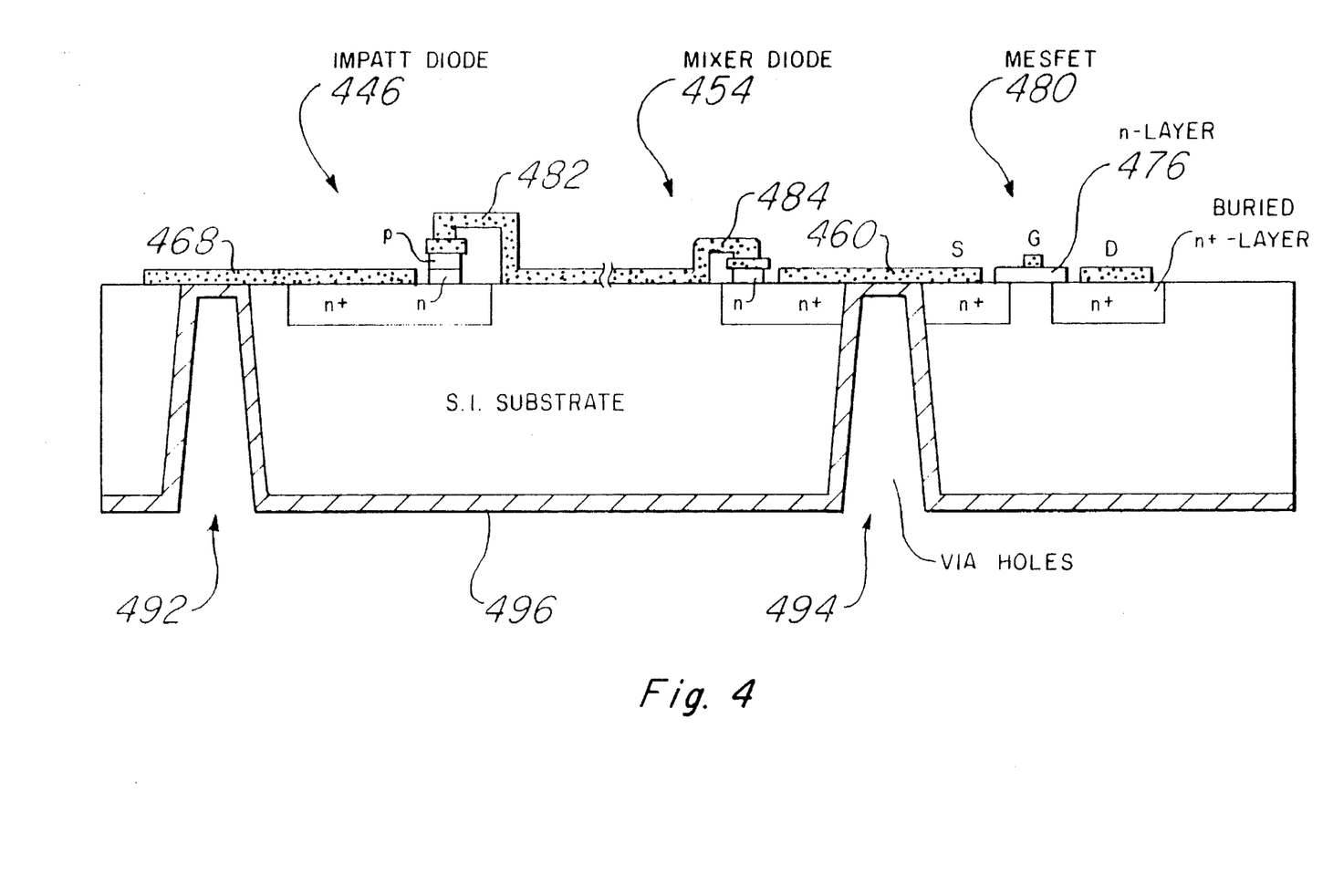
FIG. 4 is a cross sectional elevation view of a variation of the devices of FIGS. 3a–l.

FIG. 4 is a variation of the illustrative three devices showing connections of the MESFET source to the mixer diode bottom contact.

MODIFICATIONS AND ADVANTAGES

Various modifications of the preferred embodiment devices and methods may be made while retaining the features of integration of diodes and FETs.

For example, various materials could be used such as other III–V compound semiconductors like InP, InGaAs, and so forth which may improve the properties of some or all of the components, or other Schottky metals which differ for the mixers and gates or other ohmic metals. The wet etchings could be replaced by dry etching such as reactive ion etching with $BCl_3$, $CCl_2F_2$, or $CH_4$ which can produce straight sidewalls or a controlled amount of undercut. The $n^+$ implanted regions could serve as common regions for two or more devices such as the mixer diode bottom and the MESFET source; this may be preferred in some circuits where one terminal of the mixers is grounded and the number of vias needed is reduced. The mixer diode Schottky metal can be fabricated at the same time as the MESFET gate (after the ohmic contact alloying), and thus give differing mixer diode characteristics. A varactor (for a VCO) may be fabricated in a manner similar to that of the mixer diode; the Schottky contact to n type GaAs is used as the variable capacitor. The varactor can also be fabricated essentially as another IMPATT diode while the active IMPATT diodes are being fabricated; in this case the varactor diode will have a higher breakdown voltage than the Schottky diode alternative. The IMPATT diodes may be non-symmetrical and even JFETs could be fabricated by retaining the p type GaAs over the n type GaAs.

Advantages of the preferred embodiments and variations include the simplicity of fabrication and variety of devices integrated.

What is claimed is:

1. A method of fabricating an integrated circuit, comprising the steps of:
   (a) implanting contact doped regions in a semi-insulating semiconductor layer;
   (b) forming disconnected doped epitaxial semiconductor regions on said semiconductor layer and adjacent said contact regions;
   (c) forming diode regions and transistor channel regions in said epitaxial semiconductor regions;
   (d) forming diode terminals and transistor gates adjacent said diode regions and transistor channel regions; and
   (e) forming interconnections among said diodes and transistors.

2. The method of claim 1, wherein:
   (a) said semi-insulating semiconductor layer is gallium arsenide; and
   (b) said disconnected doped epitaxial regions are n-type gallium arsenide.

3. The method of claim 1, wherein:
   (a) said forming interconnections includes forming at least one air bridge connecting one of said diode terminals to a conductor on said semiconductor layer and forming transmission lines on said semiconductor layer.

4. The method of claim 3, wherein:
   (a) said forming transmission lines includes forming a ground plane on said semiconductor layer and forming conductive vias from said ground plane through said semiconductor layer to said contact regions.

\* \* \* \* \*